(12) United States Patent
Grodzki et al.

(10) Patent No.: US 12,181,549 B2
(45) Date of Patent: Dec. 31, 2024

(54) METHOD FOR DETERMINING A B0 MAP

(71) Applicant: Siemens Healthcare GmbH, Erlangen (DE)

(72) Inventors: David Grodzki, Erlangen (DE); Dieter Ritter, Fürth (DE); Armin Nagel, Bubenreuth (DE); Christian Eisen, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 88 days.

(21) Appl. No.: 18/073,547

(22) Filed: Dec. 1, 2022

(65) Prior Publication Data
US 2023/0176155 A1 Jun. 8, 2023

(30) Foreign Application Priority Data
Dec. 2, 2021 (DE) ...................... 10 2021 213 716.4

(51) Int. Cl.
*G01R 33/44* (2006.01)
*G01R 33/565* (2006.01)

(52) U.S. Cl.
CPC ..... *G01R 33/443* (2013.01); *G01R 33/56563* (2013.01)

(58) Field of Classification Search
CPC ............ G01R 33/443; G01R 33/56563; G01R 33/5608; G01R 33/243; G01R 33/3875
See application file for complete search history.

(56) References Cited

U.S. PATENT DOCUMENTS

| | | | | |
|---|---|---|---|---|
| 5,587,658 | A | * 12/1996 | Sukumar | G01R 33/3875 324/309 |
| 2012/0098538 | A1 | * 4/2012 | Shen | G01R 33/3873 324/318 |
| 2021/0088605 | A1 | 3/2021 | Shi | |

OTHER PUBLICATIONS

Shi, Yuhang, et al. "Template-based field map prediction for rapid whole brain B0 shimming." Magnetic resonance in medicine 80.1 (2018): 171-180.

\* cited by examiner

*Primary Examiner* — G. M. A Hyder
(74) *Attorney, Agent, or Firm* — Lempia Summerfield Katz LLC

(57) ABSTRACT

A method for determining a $B_0$ map for, for example, performing an imaging magnetic resonance measurement using a magnetic resonance apparatus, includes measuring an original magnetic field distribution in a measurement volume of the magnetic resonance apparatus, and computing a final $B_0$ map that describes a magnetic field distribution produced in the measurement volume of the magnetic resonance apparatus by setting a shim state. The magnetic field distribution produced in the measurement volume of the magnetic resonance apparatus by setting the shim state differs from the original magnetic field distribution.

18 Claims, 6 Drawing Sheets

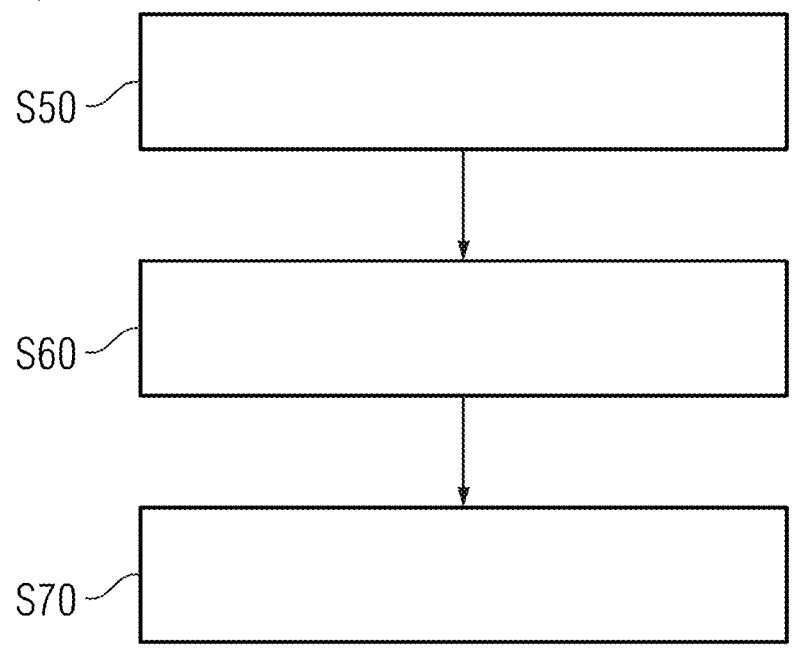

METHOD FOR DETERMINING A B0 MAP

This application claims the benefit of German Patent Application No. DE 10 2021 213 716.4, filed on Dec. 2, 2021, which is hereby incorporated by reference in its entirety.

BACKGROUND

The present embodiments relate to a method for computing a final $B_0$ map, to a magnetic resonance apparatus, and to a computer program product.

In medical technology, high soft-tissue contrasts are a particular feature of imaging using magnetic resonance (MR), also known as magnetic resonance imaging (MRI) or magnetic resonance tomography (MRT). This involves using a magnetic resonance apparatus to radiate into a region under examination, in which the object under examination is located, radiofrequency (RF) pulses for producing an RF field (also referred to as a $B_1$ field) and gradient pulses for producing magnetic field gradients. This triggers spatially encoded magnetic resonance signals in the patient. The magnetic resonance signals are received as measurement data by the magnetic resonance apparatus and used to reconstruct magnetic resonance images.

In addition, a strong static main magnetic field is produced in the region under examination. This should be as homogeneous as possible in order to avoid artifacts in the magnetic resonance images. In reality, however, the main magnetic field usually has inhomogeneities in some places. A $B_0$ map, which indicates the spatial distribution of the magnetic field strength (e.g., the magnetic field distribution) of the main magnetic field may be determined in the course of magnetic resonance examinations in order to be able to compensate for inhomogeneities in the main magnetic field. The measurement of $B_0$ field distributions may also be referred to as $B_0$ mapping. A $B_0$ map may be used for patient-specific optimization of shim currents or for image correction processes.

A series of calibration measurements may be performed before the start of an imaging magnetic resonance measurement. These are used, for example, to determine an optimum fundamental frequency of undisturbed protons, to implement preferred shim settings, or to allow dependencies on receive-coil profiles to be taken into account.

Depending on the application and purpose, the calibration may take from several seconds to over a minute, even though as short a time as possible is desirable especially in clinical routine. For some measurements, the $B_0$ distribution in the patient after shimming has been carried out is to be known, with the $B_0$ distribution generally being different before and after the shimming.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance examination of a patient during which a $B_0$ map is used is performed as quickly as possible.

A method (e.g., a computer-implemented method) for determining a final $B_0$ map (e.g., for performing an imaging magnetic resonance measurement using a magnetic resonance apparatus) is provided. The method includes measuring an original magnetic field distribution in a measurement volume of the magnetic resonance apparatus. For example, a first $B_0$-map may be determined based on this measured original magnetic field distribution. For example, a final $B_0$ map that describes (e.g., as accurately as possible) a magnetic field distribution produced in the measurement volume of the magnetic resonance apparatus by a setting (e.g., possible setting) of a shim state is determined (e.g., computed) based on the measured original magnetic field distribution and/or the first $B_0$ map that is determined therefrom. Thus, this magnetic field distribution describes a field distribution that would be produced if the shim state were to be set. The magnetic field distribution produced in the measurement volume of the magnetic resonance apparatus by setting the shim state differs from the original magnetic field distribution. In contrast with the prior art, according to which the final $B_0$ map is measured, the final $B_0$ map is determined by computing the final $B_0$ map. The computing of the final $B_0$ map may include, for example, simulating and/or estimating the final $B_0$ map.

The final $B_0$ map may then be used during the imaging magnetic resonance measurement.

For example, the measurement of the original magnetic field distribution (e.g., of the first $B_0$ map) includes acquiring magnetic resonance signals. For example, the computation of the final $B_0$ map does not include acquiring magnetic resonance signals (e.g., additional magnetic resonance signals). For example, no measurement of k-space data is carried out as part of computing the final $B_0$ map. The original magnetic field distribution (e.g., a first $B_0$ map) that is computed therefrom may constitutes the only measured data to be included in the computation of the final $B_0$ map.

For example, first, an original magnetic field distribution may be measured in a measurement volume of the magnetic resonance apparatus. Based on the measured original magnetic field distribution, a first $B_0$ map that describes the original magnetic field distribution in a measurement volume of the magnetic resonance apparatus may be determined. Thus, a $B_0$-mapping is carried out. A shim state may be set based the original magnetic field distribution (e.g., based on this first $B_0$ map). By setting the shim state, a magnetic field distribution is produced in the measurement volume of the magnetic resonance apparatus that is different from the original magnetic field distribution (e.g., by being more homogeneous than the original magnetic field distribution). In addition, a final $B_0$ map that describes the magnetic field distribution produced in the measurement volume of the magnetic resonance apparatus by the setting of the shim state is computed.

According to conventional methods, after the shim state has been set, the resulting magnetic field distribution in the form of a $B_0$ map is measured again. This measurement, however, requires valuable measurement time (e.g., up to 30 seconds), which may be avoided by the computing of the final $B_0$ map for the shim state of the present embodiments. Thus, the magnetic resonance examination may be shortened, allowing an increase in patient comfort and/or efficiency of the magnetic resonance apparatus.

Various methods for measuring a $B_0$ map are known in the prior art. For example, a measurement is performed using a plurality of echo times, and a $B_0$ map is computed based on the phase values. A $B_0$ map normally shows the distribution of the $B_0$ field. The $B_0$ field is normally the static main magnetic field of the magnetic resonance apparatus.

The measurement volume is normally a spatial region inside the magnetic resonance apparatus. At least some of the body of the patient is located in the spatial region during the magnetic resonance measurement. The measurement volume may include, for example, the field of view (FOV) of the magnetic resonance measurement.

Shimming (e.g., setting a shim state) may be correcting magnetic field inhomogeneities (e.g., caused by a main magnet, by ferromagnetic objects, or by the body of the patient). For example, in the process of setting the shim state, shim currents are conducted through at least one magnetic field coil (e.g., at least one gradient coil and/or at least one dedicated shim coil). Weak additional magnetic fields may thereby be produced in various spatial directions, for example, for the purpose of correcting inhomogeneities in the main magnetic field. In first-order shimming, a shim current is usually conducted through at least one gradient coil. In second-order shimming, a shim current is usually conducted through at least one dedicated shim coil. The magnetic resonance apparatus may include, for example, a control unit that controls the current flow through the at least one magnetic field coil.

By setting the shim state, a magnetic field distribution that has a higher homogeneity than the original magnetic field distribution before the setting of the shim state may be produced in the measurement volume of the magnetic resonance apparatus. A high homogeneity may be advantageous, for example, for spectral fat saturation, for off-center imaging, for echoplanar imaging, and/or for MR spectroscopy. The homogeneity may be specified, for example, parts per million (ppm); the lower this value is, the higher the homogeneity.

For computing the final $B_0$ field, the magnetic resonance apparatus may include, for example, a system control unit that has one or more processors and/or one or more memory modules.

The final $B_0$ map may be used to compute control signals for the transmission of an RF pulse by at least one transmit antenna (e.g., a plurality of transmit antennas) of the magnetic resonance apparatus. For example, the RF pulse may be a dynamic pulse (e.g., an RF pulse that is used to set selectively a specific flip-angle distribution and also frequency distribution in image space). For example, the RF pulse may be a multichannel RF pulse (e.g., an RF pulse that is transmitted by a plurality of transmit antennas transmitting in parallel). Precise knowledge of the magnetic field distribution is advantageous, for example, for this application.

A further embodiment of the method provides that, for the purpose of setting the shim state, electric shim currents for at least one magnetic field coil of the magnetic resonance apparatus are determined based on the original magnetic field distribution. The final $B_0$ map is then computed based on the original magnetic field distribution and the determined shim currents for the at least one magnetic field coil of the magnetic resonance apparatus.

In one embodiment, the electric shim currents are determined under the boundary condition that operation of the at least one magnetic field coil of the magnetic resonance apparatus using the shim currents produces an additional magnetic field distribution that homogenizes the total resultant magnetic field distribution as far as possible. Artifacts in magnetic resonance images may be reduced by a homogeneous magnetic field distribution.

Even with the use of shim currents, it is not normally possible to achieve a perfectly homogeneous magnetic field distribution. For example, if the magnetic resonance apparatus does not have a dedicated shim coil, then it is normally not possible to compensate for higher-order variations. Even if one or more dedicated shim coils are available, however, these normally cannot produce any three-dimensional compensation fields exactly. Therefore, determining the final $B_0$ map that normally describes variations from a perfectly homogeneous magnetic field distribution is advantageous for the imaging magnetic resonance measurement.

An additional magnetic field distribution brought about in the measurement volume of the magnetic resonance apparatus by the determined shim currents may be computed, and the additional magnetic field distribution is added to the original magnetic field distribution in the measurement volume of the magnetic resonance apparatus.

A further embodiment of the method provides that a trained function is employed for the purpose of computing the final $B_0$ map. The original magnetic field distribution (e.g., the first $B_0$ map) is received as the input data of the trained function, and the trained function is applied thereto. The final $B_0$ map is output as the output data of the trained function.

A trained function maps input data onto output data. The output data may depend, for example, also on one or more parameters of the trained function. The one or more parameters of the trained function may be ascertained and/or adapted by training. Ascertaining and/or adapting the one or more parameters of the trained function may be based, for example, on a pair composed of training input data and associated training output data. The trained function for generating training mapping data is applied to the training input data. For example, the ascertaining and/or adapting may be based on a comparison of the training mapping data and the training output data. In general, a trainable function (e.g., a function containing one or more parameters yet to be adapted) is also referred to as a trained function.

Other terms for trained function may be, for example, trained mapping rule, mapping rule containing trained parameters, function containing trained parameters, algorithm based on artificial intelligence, or machine-learning algorithm. An example of a trained function is an artificial neural network, where edge weights of the artificial neural network are equivalent to the parameters of the trained function. The term "neural net" may also be used instead of the term "neural network". For example, a trained function may also be a deep artificial neural network (or a deep neural network). Another example of a trained function is a "support vector machine", and, for example, other machine-learning algorithms may also be used as the trained function.

The trained function may be trained as follows. A plurality of original magnetic field distributions in a measurement volume of a training magnetic resonance apparatus and/or a plurality of first training $B_0$ maps are received, where each first training $B_0$ map of the plurality of first training $B_0$ maps has been computed based on an original magnetic training field distribution and/or describes an original magnetic training field distribution in a measurement volume of a training magnetic resonance apparatus. A plurality of final training $B_0$ maps are received, where each final training $B_0$ map of the plurality of final training $B_0$ maps describes a measured magnetic training field distribution in the measurement volume of the training magnetic resonance apparatus in a training shim state in which the measured magnetic training field distribution is different than the original magnetic training field distribution. The trained function is trained by the plurality of original magnetic training field distributions and/or the first training $B_0$ maps and the plurality of final training $B_0$ maps.

Thus, the trained function may be trained using measured training $B_0$ maps that are measured before the setting of the training shim state (e.g., the plurality of first training $B_0$ maps) and after the setting of the shim state (e.g., the plurality of final training $B_0$ maps). For example, the plurality of first training $B_0$ maps are training input data of the trained function. For example, the plurality of final training $B_0$ maps are training output data of the trained function.

The training magnetic resonance apparatus may be the same magnetic resonance apparatus that is used to perform an imaging magnetic resonance measurement using a final $B_0$ map computed according to the proposed method. It may also be another magnetic resonance apparatus, however. The measurement volume in the training phase of the trained function may differ from the measurement volume during application of the trained function, or the measurement volume in the training phase of the trained function may be the same as the measurement volume during application of the trained function.

The training shim state may be set in the same manner as the previously described shim state (e.g., these previously described features may also be applied to the shimming procedure in the training phase of the trained function).

The computing of the final $B_0$ map may be executed particularly quickly and accurately by the use of a trained function.

A further embodiment of the method provides that setting the shim state includes determining electric shim currents for at least one magnetic field coil of the magnetic resonance apparatus. The final $B_0$ map is then computed as follows. First, a provisional $B_0$ field is computed based on the original magnetic field distribution and the determined shim currents for the at least one magnetic field coil. This provisional $B_0$ map is received as input data of a further trained function. The term "further" is used here to distinguish the trained function referred to here from the previously described trained function. For example, the term does not imply that a plurality of trained functions are necessarily employed in the proposed method. The features of the trained function already described above may also be applied correspondingly to the further trained function. The further trained function is applied to this input data. The final $B_0$ map is output as output data of the further trained function.

The provisional $B_0$ map may already constitute a good approximation of the actual magnetic field distribution (e.g., the difference therefrom is relatively small). Hence, only a small amount of data is needed for training the further trained function, and/or a particularly exact final $B_0$ map may be determined.

The further trained function may be trained, for example, as follows. A plurality of provisional training $B_0$ maps are computed. In addition, a plurality of final training $B_0$ maps are received, where each final training $B_0$ map of the plurality of final training $B_0$ maps describes a measured magnetic training field distribution in the measurement volume of the training magnetic resonance apparatus in a training shim state; in the training shim state, the measured magnetic training field distribution is different than the original magnetic training field distribution. The further trained function is trained by the plurality of provisional training $B_0$ maps and the plurality of final training $B_0$ maps.

The computing of the plurality of training $B_0$ maps may include, in each case, the following. An original magnetic training field distribution or a first training $B_0$ map is measured, where the first $B_0$ map describes an original magnetic training field distribution in a measurement volume of a training magnetic resonance apparatus. Electric training shim currents for at least one magnetic field coil of a training magnetic resonance apparatus are determined based on the original magnetic training field distribution for the purpose of setting a shim state. The provisional training $B_0$ map is computed based on the original magnetic training field distribution and the determined training shim currents for the at least one magnetic field coil of the training magnetic resonance apparatus.

The receiving of data (e.g., the plurality of original magnetic training field distributions or the plurality of first training $B_0$ maps, the plurality of final training $B_0$ maps, or the plurality of provisional training $B_0$ maps) and/or output of data (e.g., the final $B_0$ maps) for the application and/or training of a trained function may be implemented, for example, by one or more interfaces suitable for this purpose. The application and/or training of a trained function may be implemented, for example, by a computing unit suitable for this purpose, which has, for example, one or more processors and/or one or more memory modules.

A system control unit for a magnetic resonance apparatus is also provided. The system control unit (e.g., including a processor) is configured to receive a first original magnetic field distribution in a measurement volume of the magnetic resonance apparatus (e.g., to receive a $B_0$ map that describes an original magnetic field distribution in a measurement volume of the magnetic resonance apparatus (10)) (S10). The system control unit is configured to compute a final $B_0$ map that describes a magnetic field distribution produced in the measurement volume of the magnetic resonance apparatus (10) by setting a shim state (S30). A magnetic field distribution produced in the measurement volume of the magnetic resonance apparatus (10) by setting the shim state differs from the original magnetic field distribution.

In addition, a magnetic resonance apparatus that is configured to perform an above-described method is provided.

The advantages of the system control unit of the present embodiments and of the magnetic resonance apparatus of the present embodiments are essentially the same as the advantages detailed above for the method for computing a final $B_0$ map for performing an imaging magnetic resonance measurement. Features, advantages, or alternative embodiments mentioned in this connection may also be applied to the computer program product described below, and vice versa.

A computer program product that includes a program and may be loaded directly into a memory of a programmable system control unit of a magnetic resonance apparatus is provided. The computer program product has program means (e.g., libraries and auxiliary functions) and may execute a method of the present embodiments when the computer program product is executed in the system control unit of the magnetic resonance apparatus. The computer program product may include software containing a source code that still needs to be compiled and linked or just needs to be interpreted, or an executable software code that, for execution, only needs to be loaded into the system control unit. The method may be performed quickly, reproducibly, and robustly by the computer program product. The computer program product is configured such that the computer program product may perform the described method acts using the system control unit.

The system control unit has the specifications such as, for example, a suitable RAM, a suitable graphics card, or a suitable logic unit in order to be able to perform the respective method acts efficiently. The computer program product is stored, for example, on a computer-readable medium (e.g., a non-transitory computer-readable storage medium) or on a network or server, from where the computer program product may be loaded into the processor of a local system control unit. The processor may be connected directly to the magnetic resonance apparatus or may form part of the magnetic resonance apparatus.

In addition, control data of the computer program product may be stored on an electronically readable data storage medium (e.g., a non-transitory computer-readable storage medium). The control data in the electronically readable data storage medium may be embodied such that the control data performs a method of the present embodiments when the data storage medium is used in a system control unit of a magnetic resonance apparatus. Examples of electronic readable data storage media are a DVD, a magnetic tape, or a USB stick, on which electronically readable control data (e.g., software) is stored. When this control data is read from the data storage medium and stored in a system control unit of the magnetic resonance apparatus, all the above-described methods of the present embodiments may be performed. Hence, the present embodiments may also proceed from the computer-readable medium and/or from the electronically readable data storage medium.

BRIEF DESCRIPTION OF THE DRAWINGS

Further advantages, features, and details of the present embodiments appear in the embodiments described below and follow from the drawings. Corresponding parts are denoted by the same reference signs in all the figures, in which:

FIG. 6 is a block diagram of a method for training a trained function.

DETAILED DESCRIPTION

Figure 1:
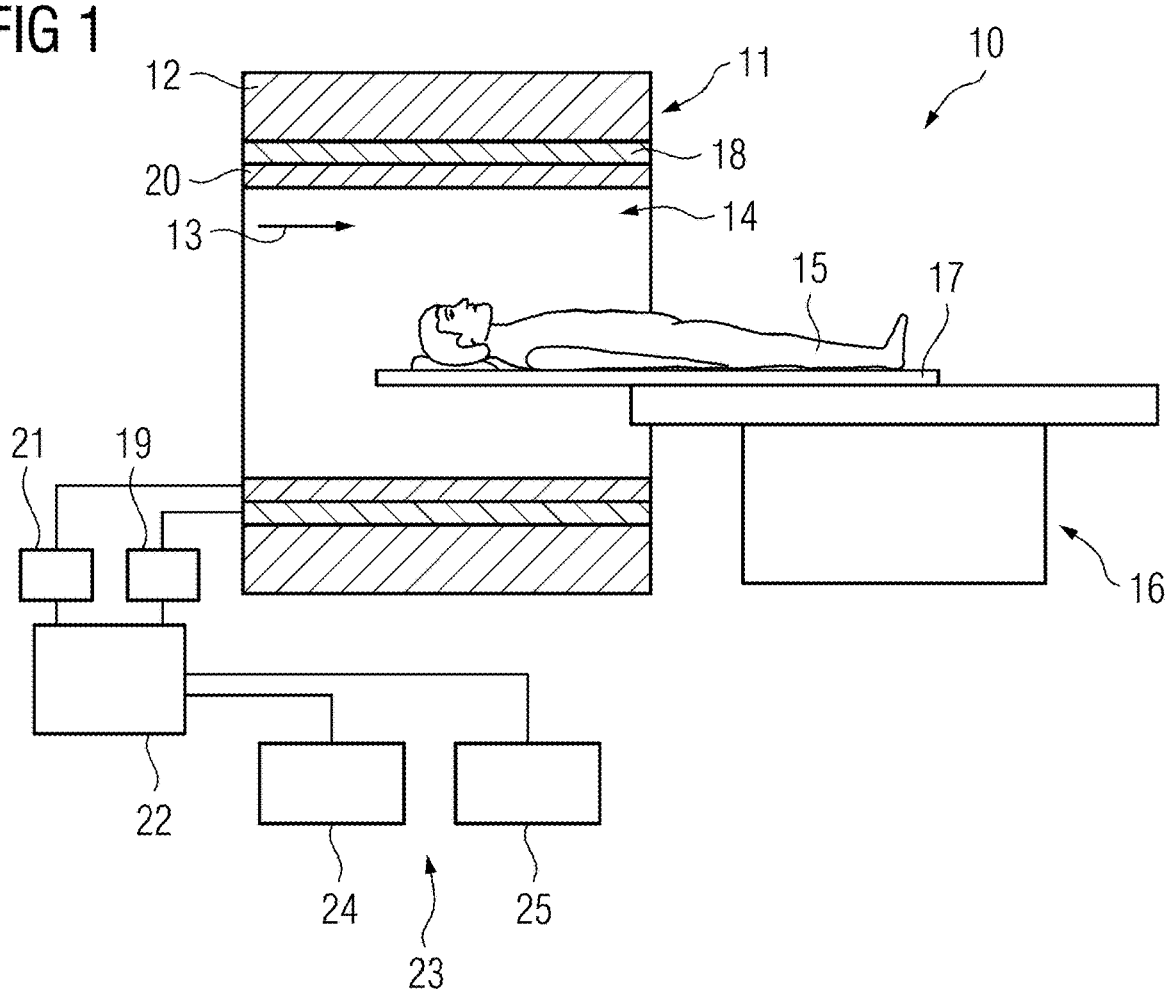
FIG. 1 is a schematic diagram of one embodiment of a magnetic resonance apparatus.

FIG. 1 shows schematically one embodiment of a magnetic resonance apparatus 10. The magnetic resonance apparatus 10 includes a patient placement zone 14 for accommodating a patient 15. In the present exemplary embodiment, the patient placement zone 14 is shaped as a cylinder and is enclosed in a circumferential direction cylindrically by a magnet unit 11. In principle, however, the patient placement zone 14 may have a different design. The patient 15 may be moved into the patient placement zone 14 by a patient positioning apparatus 16 of the magnetic resonance apparatus 10. The patient positioning apparatus 16 includes for this purpose a patient couch 17 that is configured to be able to move inside the patient placement zone 14.

The magnet unit 11 includes a main magnet 12 for producing a powerful main magnetic field 13 that, for example, is constant over time. For example, the main magnetic field 13 and the interaction thereof with the patient 15 results in a magnetic field distribution $B_0$ in a measurement volume inside the patient placement zone 14. This magnetic field distribution $B_0$ may be represented in the form of a $B_0$ map. The magnet unit 11 further includes a gradient coil unit 18 for generating magnetic field gradients that are used for spatial encoding during imaging. The gradient coil unit 18 is controlled by a gradient control unit 19 of the magnetic resonance apparatus 10.

The magnet unit 11 also includes a radiofrequency antenna unit 20 that, in the present exemplary embodiment, is in the form of a body coil that is fixedly integrated in the magnetic resonance apparatus 10. The radiofrequency antenna unit 20 is controlled by a radiofrequency antenna control unit 21 of the magnetic resonance apparatus 10 and radiates radiofrequency magnetic resonance sequences into an examination space that is largely formed by a patient placement zone 14 of the magnetic resonance apparatus 10. A $B_1$ distribution and excitation of atomic nuclei is thereby established in the main magnetic field 13 produced by the main magnet 12. Magnetic resonance signals are produced by relaxation of the excited atomic nuclei. The radiofrequency antenna unit 20 is configured to receive the magnetic resonance signals.

The magnetic resonance apparatus 10 includes a system control unit 22 for controlling the main magnet 12, the gradient control unit 19, and the radiofrequency antenna control unit 21. The system control unit 22 centrally controls the magnetic resonance apparatus 10 (e.g., implementing a predetermined imaging gradient echo sequence). In addition, the system control unit 22 includes an analysis unit (not presented in further detail) for analyzing the magnetic resonance signals captured during the magnetic resonance examination. In addition, the magnetic resonance apparatus 10 includes a user interface 23 that is connected to the system control unit 22. Control data such as imaging parameters, for example, and reconstructed magnetic resonance images may be displayed to medical personnel on a display unit 24 (e.g., on at least one monitor) of the user interface 23. In addition, the user interface 23 includes an input unit 25 that may be used by the medical operating personnel to enter data and/or parameters during a measurement procedure.

Typically, a series of calibration measurements are performed before the start of an imaging magnetic resonance measurement (e.g., the measurement of the magnetic resonance signals from which magnetic resonance images may be reconstructed, such as clinical and/or diagnostic magnetic resonance images). Depending on the application, these are used, for example, to determine an optimum fundamental frequency of undisturbed protons, to implement preferred shim settings, or to allow dependencies on receive-coil profiles to be taken into account.

For some types of imaging magnetic resonance measurements, a $B_0$ distribution in the object under examination after shimming has been carried out is to be known, with the $B_0$ distribution generally being different before and after the shimming. This may be the case, for example, if a measurement uses dynamic or multichannel RF pulses, for the computation of which of the $B_0$ and/or the $B_1$ distribution is to be known.

Different embodiments of a method are described below in which, based on a first $B_0$ map measured before a shimming procedure, a final $B_0$ map for the state after the shimming procedure is computed using algorithm. It is thereby possible to dispense with measuring the $B_0$ map after shimming. The embodiments are characterized, for example, in that the final $B_0$ map may be computed from shim currents used and/or may be ascertained by a trained function (e.g., a deep-learning algorithm). The features mentioned below of any method acts that arise in more than one embodiment and have the same reference sign may also be applied to embodiments that are described without mention of these features.

Figure 2:
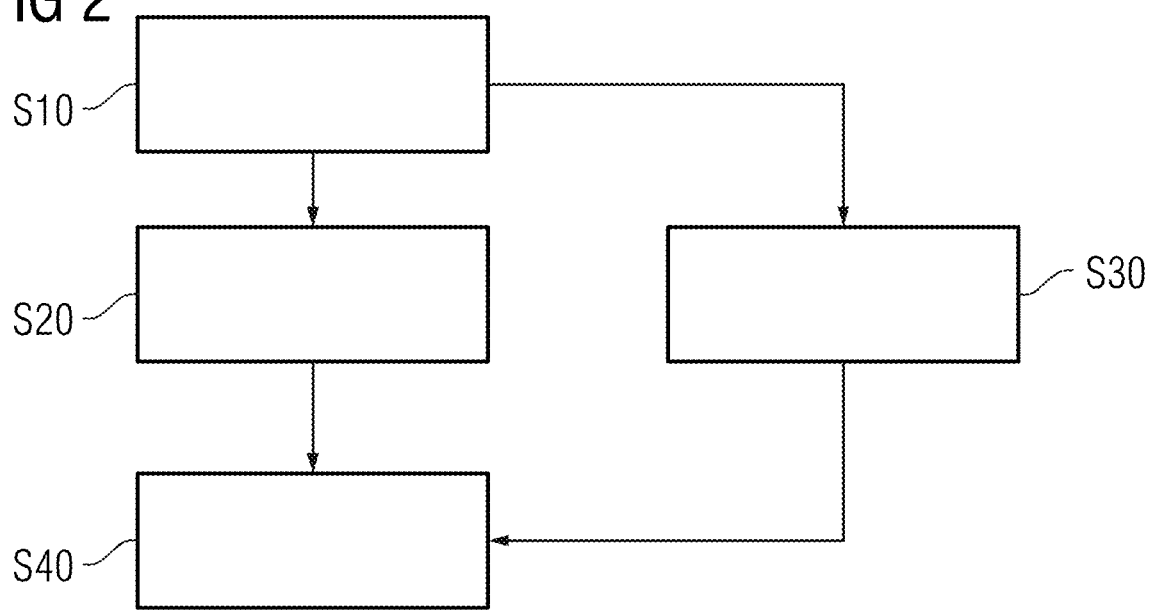
FIG. 2 is a block diagram of a first embodiment of a method.

FIG. 2 shows one embodiment of a method for computing a final $B_0$ map (e.g., for performing an imaging magnetic resonance measurement using the magnetic resonance apparatus 10). In S10, an original magnetic field distribution in a measurement volume of the magnetic resonance apparatus 10 is measured (e.g., a first $B_0$ map that describes an original magnetic field distribution in a measurement volume of the magnetic resonance apparatus 10). This measurement may be performed using a 3-echo method. The first $B_0$ map may be determined based on the measured original magnetic field distribution, and therefore, the first $B_0$ map may also be regarded as a measured $B_0$ map.

In S20, a shim state is set based on the first $B_0$ map. The magnetic field distribution produced in the measurement volume of the magnetic resonance apparatus 10 by the setting of the shim state differs from the original magnetic field distribution. The resulting magnetic field distribution may be more homogeneous than the original magnetic field distribution. For the purpose of setting the shim state, the gradient control unit 19, for example, controls the gradient coil unit 18 in a suitable manner to perform 1st-order shimming. The magnetic resonance apparatus 10 may also include dedicated shim coils (not shown in FIG. 1) that may be used to compensate for (e.g., to shim) higher orders as well.

In S30, a final $B_0$ map is computed. The final $B_0$ map describes the magnetic field distribution produced in the measurement volume of the magnetic resonance apparatus 10 by the setting of the shim state. The computing may be carried out in the system control unit 22, for example. In S40, the imaging magnetic resonance measurement is performed. For example, this involves measuring magnetic resonance signals from which magnetic resonance images of the patient may be reconstructed. The computed final $B_0$ map is used to perform this measurement (e.g., to compute dynamic and/or multichannel RF pulses). In contrast with conventional imaging magnetic resonance examinations, by computing the final $B_0$ map, it is possible to dispense with the time-consuming measurement of a $B_0$ map in the shim state.

Figure 3:
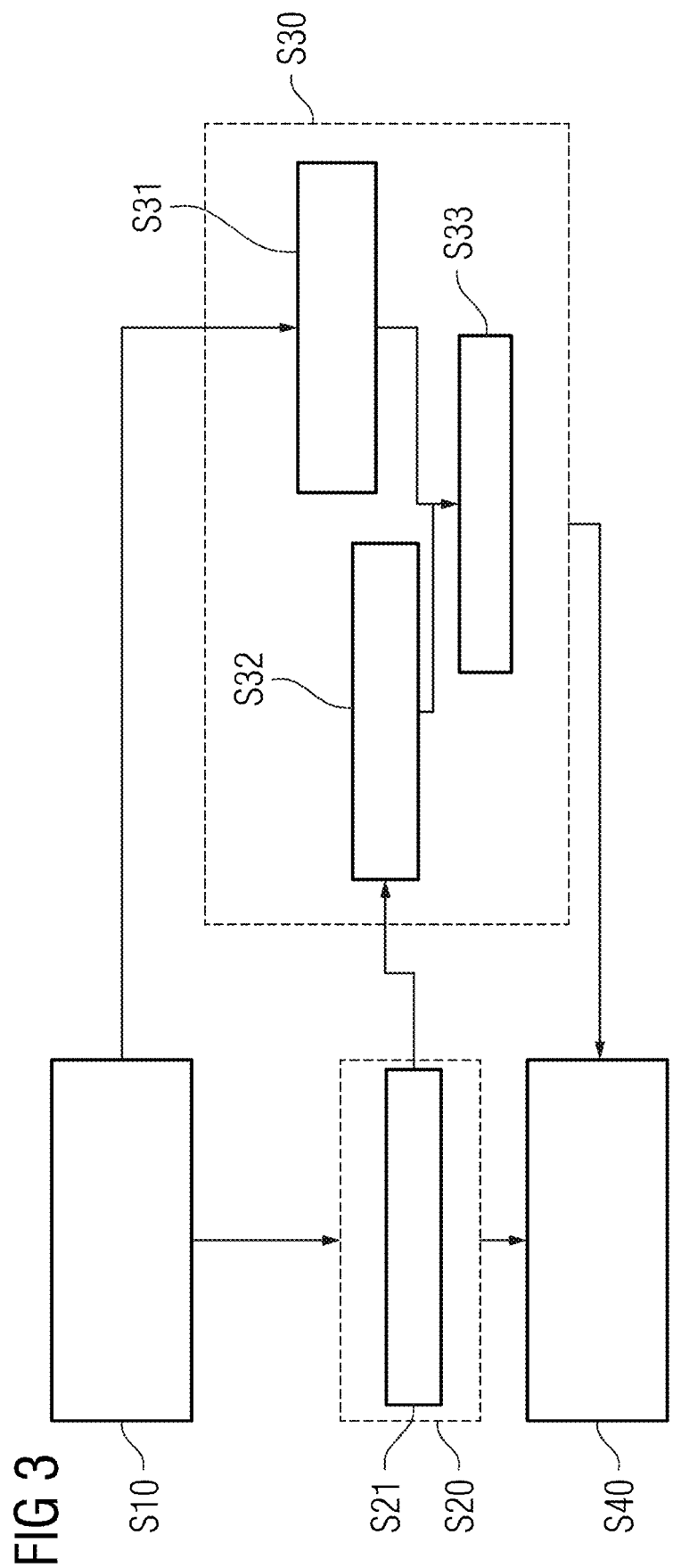
FIG. 3 is a block diagram of a second embodiment of the method.
Figure 4:
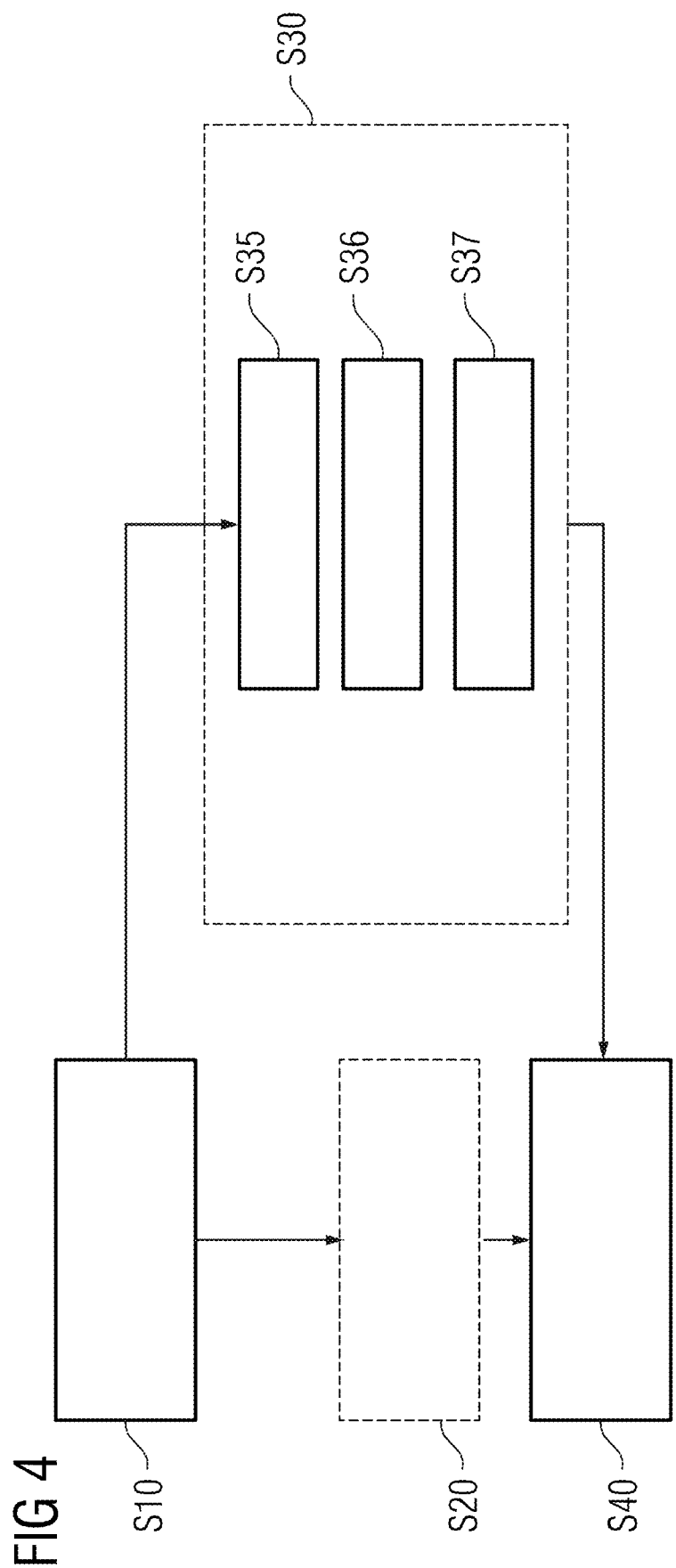
FIG. 4 is a block diagram of a third embodiment of the method.
Figure 5:
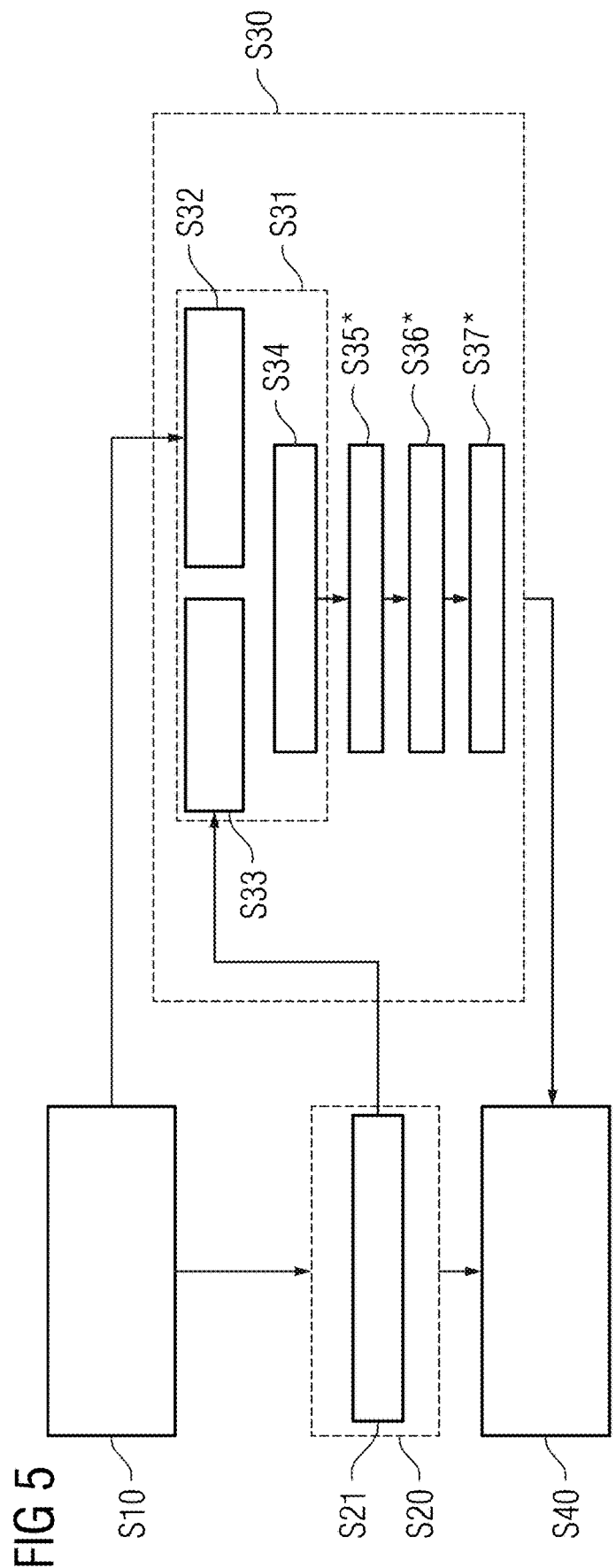
FIG. 5 is a block diagram of a fourth embodiment of the method.

FIGS. 3 to 5 show different ways of computing the final $B_0$ map.

According to FIG. 3, setting the shim state in S20 includes determining electric shim currents for at least one magnetic field coil of the magnetic resonance apparatus 10 based on the original magnetic field distribution in S21. The at least one magnetic field coil may be, for example, the aforementioned gradient coil unit 18 and/or a dedicated shim coil.

The final $B_0$ map is then computed based on the original magnetic field distribution and the determined shim currents for the at least one magnetic field coil of the magnetic resonance apparatus. Thus, the computing of the final $B_0$ map in S30 includes computing, in S32, an additional magnetic field distribution created in the measurement volume of the magnetic resonance apparatus 10 by the shim currents determined in S21. Since the shim currents that are used for the imaging magnetic resonance measurement performed in S40 are known anyway, these may be simulated, for example, and the additional magnetic field distribution resulting therefrom may be computed.

In addition, the original magnetic field distribution measured in S10 is provided in S31. In S33, the original field distribution and the additional magnetic field distribution are added, and the final $B_0$ map is ascertained from the result of the addition. This resultant final $B_0$ map may then be a close approximation to the state during shimming.

As described below in greater detail, FIG. 4 shows an embodiment of the method depicted in FIG. 2, in which the final $B_0$ map is ascertained by a trained function (e.g., a deep-learning method). The method includes an algorithm that was set in a training phase and in which a sufficient number of pairs of first a measured $B_0$ map before the shimming and second a measured $B_0$ map after the shimming were used in order to train the trained function and/or a neural network. After the training phase, the algorithm may be used such that the algorithm provides, from a $B_0$ map measured before the shimming, an expected $B_0$ map after the shimming.

For example, in S35, the first $B_0$ map is received as input data of a trained function (e.g., by the system control unit 22). In S36, the trained function is applied to the input data. In S37, the final $B_0$ map is output as output data of the trained function.

FIG. 5 shows an embodiment of the method depicted in FIG. 2, which may be regarded as a combination of aspects of the embodiments depicted in FIG. 3 and FIG. 4. In one embodiment, a trained function (e.g., a deep-learning method) may learn a difference between a $B_0$ map computed using a method according to FIG. 3, and an actually measured $B_0$ map, and thus improve the method.

For example, computing the final $B_0$ map in S30 includes computing a provisional $B_0$ field in S31 based on the original magnetic field distribution and the shim currents determined in S21 for the at least one magnetic field coil.

For example, in order to compute a provisional $B_0$ map, an additional magnetic field distribution brought about in the measurement volume of the magnetic resonance apparatus by the determined shim currents is computed in S33. In S32, the original magnetic field distribution is provided. In S34, the additional magnetic field distribution is added to the original magnetic field distribution in the measurement volume of the magnetic resonance apparatus 10, resulting in the provisional $B_0$ map.

In S35*, the provisional $B_0$ map is received as input data of a further trained function. In S36*, the further trained function is applied to the input data. In S37*, the final $B_0$ map is output as output data of the further trained function.

FIG. 6 shows training a trained function. In S50, input training data is received. According to the embodiment shown in FIG. 4, the input training data may include, for example, a plurality of first training $B_0$ maps, each of which describes an original magnetic training field distribution in a measurement volume of a training magnetic resonance apparatus.

According to the embodiment shown in FIG. 5, the input training data may include, for example, a plurality of provisional training $B_0$ maps. Each provisional training $B_0$ map of the plurality of provisional training $B_0$ maps may be computed as follows. A first training $B_0$ map is measured, where the first $B_0$ map describes an original magnetic training field distribution in a measurement volume of a training magnetic resonance apparatus. Electric training shim currents for at least one magnetic field coil of a training magnetic resonance apparatus are determined based on the original magnetic training field distribution for the purpose of setting a shim state. The provisional training $B_0$ map is computed based on the original magnetic training field distribution and the determined training shim currents for the at least one magnetic field coil of the training magnetic resonance apparatus.

In S60, output training data is received. According to the embodiments shown in FIGS. 4 and 5, the output training data may include, for example, a plurality of final training $B_0$ maps, each of which describes a measured magnetic training field distribution in the measurement volume of the training magnetic resonance apparatus in a training shim state in which the measured magnetic training field distribution is different from the original magnetic training field distribution.

In S70, a trained function is trained based on the first training data and the final training data (e.g., based on the plurality of first training $B_0$ maps or the plurality of provisional training $B_0$ maps, and the plurality of final training $B_0$ maps).

The acts S50, S60, and S70 may be performed, for example, by a system control unit of the training magnetic resonance apparatus and by a dedicated computing unit (e.g., a dedicated computer). The training data may be acquired by the same magnetic resonance apparatus 10 that is then also used to acquire the data to which the trained function is applied. It is also possible, however, to use other magnetic resonance apparatuses for acquiring the training data.

To summarize, the proposed embodiments may be used to determine a $B_0$ map after the shimming from a measured $B_0$ map before the shimming, with the result that the time for measuring the final $B_0$ map may be saved. The computing may be performed, for example, based on the shim currents used and/or a trained function or a trained network. Thus, compared with conventional methods, calibration time before the start of the measurement may be saved, thereby speeding up the entire measurement. This may also help towards acceptance of methods using dynamic and/or multichannel RF pulses.

The methods described in detail above and the presented magnetic resonance apparatus are merely embodiments that may be modified by a person skilled in the art in many ways without departing from the scope of the invention. In addition, the use of the indefinite article "a" or "an" does not rule out the possibility of there also being more than one of the features concerned. Likewise, the term "unit" does not exclude the possibility that the components in question consist of a plurality of interacting sub-components that may also be spatially distributed if applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for computing a final $B_0$ map for performing an imaging magnetic resonance measurement using a magnetic resonance apparatus, the method comprising:

measuring an original magnetic field distribution in a measurement volume of the magnetic resonance apparatus; and computing a final $B_0$ map that describes a magnetic field distribution produced in the measurement volume of the magnetic resonance apparatus by setting a shim state, wherein the measured original magnetic field distribution is the only measured data included in the computing of the final $B_0$ map, and wherein a magnetic field distribution produced in the measurement volume of the magnetic resonance apparatus by setting the shim state differs from the original magnetic field distribution.

2. The method of claim 1, further comprising setting the shim state based on the original magnetic field distribution.

3. The method of claim 2, wherein setting the shim state based on the original magnetic field distribution comprises setting the shim state based on a first $B_0$ map that is determined from the original magnetic field distribution.

4. The method of claim 2, wherein setting the shim state comprises determining electric shim currents for at least one magnetic field coil of the magnetic resonance apparatus based on the original magnetic field distribution, wherein the computing of the final $B_0$ map is carried out based on the original magnetic field distribution and the determined electric shim currents for the at least one magnetic field coil of the magnetic resonance apparatus.

5. The method of claim 2, wherein setting the shim state comprises determining electric shim currents for at least one magnetic field coil of the magnetic resonance apparatus, and wherein computing the final $B_0$ map comprises:

computing a provisional $B_0$ field based on the original magnetic field distribution and the determined electric shim currents for the at least one magnetic field coil;

receiving the provisional $B_0$ map as input data of a trained function;

applying the trained function to the input data; and outputting the final $B_0$ map as output data of the further trained function.

6. The method of claim 5, wherein computing the provisional $B_0$ map comprises:

computing an additional magnetic field distribution brought about in the measurement volume of the magnetic resonance apparatus by the determined electric shim currents; and adding the additional magnetic field distribution to the original magnetic field distribution in the measurement volume of the magnetic resonance apparatus.

7. The method of claim 4, wherein the computing of the final $B_0$ map is carried out based on a first $B_0$ map that is determined from the original magnetic field distribution.

8. The method as claimed in claim 4, further comprising computing an additional magnetic field distribution brought about in the measurement volume of the magnetic resonance apparatus by the determined shim currents, wherein the additional magnetic field distribution is added to the original magnetic field distribution in the measurement volume of the magnetic resonance apparatus.

9. The method of claim 1, further comprising computing control signals using the final $B_0$ map, the control signals being for transmission of a radio frequency (RF) pulse by at least one transmit antenna of the magnetic resonance apparatus.

10. The method of claim 9, wherein the at least one transmit antenna comprises a plurality of transmit antennas.

11. The method of claim 1, wherein computing the final $B_0$ map comprises:

receiving the original magnetic field distribution or a $B_0$ map as input data of a trained function;

applying the trained function to the input data; and outputting the final $B_0$ map as output data of the trained function.

12. The method of claim 11, wherein receiving the original magnetic field distribution or the $B_0$ map as the input data of the trained function comprises receiving a first $B_0$ map that is determined from the original magnetic field distribution as the input data of the trained function.

13. The method of claim 1, further comprising performing an imaging magnetic resonance measurement using the magnetic resonance apparatus and the final $B_0$ map.

14. A system control unit for a magnetic resonance apparatus, the system control unit comprising:

a processor configured to:

receive an original magnetic field distribution in a measurement volume of the magnetic resonance apparatus;

compute a final $B_0$ map that describes a magnetic field distribution produced in the measurement volume of the magnetic resonance apparatus by setting a shim state, wherein the received original magnetic field distribution is the only measured data included in the computation of the final $B_0$ map, and wherein a magnetic field distribution produced in the measurement volume of the magnetic resonance apparatus by setting the shim state differs from the original magnetic field distribution.

15. A magnetic resonance apparatus comprising:

a system control unit comprising:

a processor configured to:

measure an original magnetic field distribution in a measurement volume of the magnetic resonance apparatus;

set a shim state in the measurement volume of the magnetic resonance apparatus based on the measured original magnetic field distribution, wherein a magnetic field distribution produced in the measurement volume of the magnetic resonance apparatus by setting the shim state differs from the original magnetic field distribution; and compute a final $B_0$ map that describes a magnetic field distribution produced in the measurement volume of the magnetic resonance apparatus by the setting of a shim state, wherein the measured original magnetic field distribution is the only measured data included in the computation of the final $B_0$ map.

16. The magnetic resonance apparatus of claim 15, wherein the magnetic resonance apparatus is configured to perform an imaging magnetic resonance measurement using the final $B_0$ map.

17. In a non-transitory computer-readable storage medium that stores instructions executable by a system control unit of a magnetic resonance apparatus to compute a final $B_0$ map for performing an imaging magnetic resonance measurement using a magnetic resonance apparatus, the instructions comprising:

measuring an original magnetic field distribution in a measurement volume of the magnetic resonance apparatus; and computing a final $B_0$ map that describes a magnetic field distribution produced in the measurement volume of the magnetic resonance apparatus by setting a shim state, wherein the measured original magnetic field distribution is the only measured data included in the computing of the final $B_0$ map, and wherein a magnetic field distribution produced in the measurement volume of the magnetic resonance apparatus by setting the shim state differs from the original magnetic field distribution.

18. The non-transitory computer-readable storage medium of claim 17, wherein the instructions further comprise setting the shim state based on the original magnetic field distribution.

\* \* \* \* \*